United States Patent [19]
Deckert et al.

[11] Patent Number: 6,137,303
[45] Date of Patent: Oct. 24, 2000

[54] INTEGRATED TESTING METHOD AND APPARATUS FOR SEMICONDUCTOR TEST OPERATIONS PROCESSING

[75] Inventors: Richard Allan Deckert; Steven Engelking; Joey Dean Evans, all of San Antonio, Tex.

[73] Assignees: Sony Corporation, Tokyo, Japan; Sony Electronics Inc., Park Ridge, N.J.

[21] Appl. No.: 09/211,455

[22] Filed: Dec. 14, 1998

[51] Int. Cl.[7] ................................................. G01R 1/04
[52] U.S. Cl. ..................... 324/765; 324/158.1; 414/757; 414/225
[58] Field of Search ................................ 324/765, 158.1, 324/766, 767; 414/757, 225

[56] References Cited

U.S. PATENT DOCUMENTS

| | | | |
|---|---|---|---|
| 4,907,931 | 3/1990 | Mallory et al. | 414/225 |
| 4,938,654 | 7/1990 | Schram | 414/757 |
| 5,105,147 | 4/1992 | Karasikov et al. | 324/158.1 |
| 5,374,888 | 12/1994 | Karasawa | 324/765 |

OTHER PUBLICATIONS

Tokyo Seimitsu Co., Ltd., Catalog for Wafer Probing Machine, Dec. 4, 1997.
KLA 1007 Service Manual, Dec. 1989, 3 pages: 3–2; 4–42 and 4–43.
Service Manual for Ultrastation 3.B Model 2 Superstructure, circa 1997.

*Primary Examiner*—Glenn W. Brown
*Assistant Examiner*—Jimmy Nguyen
*Attorney, Agent, or Firm*—Wood, Herron & Evans, L.L.P.

[57] ABSTRACT

A semiconductor wafer testing and inspecting apparatus and method are provided in which a plurality of tests are performed on each of a plurality of wafers from a wafer cassette and before the wafers are returned to a packaging cassette or further processing. A carousel conveyor receives each wafer from a cassette and indexes it through each of a plurality of testing stations, including preferably at least two electrical testing stations at which a probe contacts each device or die on the wafer to perform an electrical test, with the two stations performing different electrical tests. The wafers are each moved through at least one visual or optical testing station at which each of the dies on the wafer is inspected. Preferably, a testing head or probe is moved in a plane parallel to the wafer sequentially to positions over each of the devices on the wafer to perform a test on or otherwise inspect the devices on the wafer. When in each of the positions, the wafer is lifted by a "pop-up" chuck or elevator that brings a device on the wafer into contact with the probe needles. A robot arm may be provided in addition or in the alternative to the carousel to move the wafers, for example, into and out of cassettes, to and from a standby station, or to and from a testing station or holder on the carousel.

24 Claims, 4 Drawing Sheets

INTEGRATED TESTING METHOD AND APPARATUS FOR SEMICONDUCTOR TEST OPERATIONS PROCESSING

This invention relates to semiconductor processing and particularly to processes and equipment for testing, inspecting and sorting semiconductor wafers following the completion of certain processes or series of processes in semiconductor manufacture.

BACKGROUND OF THE INVENTION

In the manufacture of semiconductors, wafers are subjected to processes by which layers of materials are applied and etched by various sequences of physical, chemical, photographic and other process steps to produce stacks of layers defining a large number of electrical devices and circuits on each of the dies on the wafer. The individual devices or circuits are eventually separated and encased to form chips and other modules for use in electronic equipment. Series of processes performed on individual wafers are usually performed on more than one machine which may be located at one or more facilities or locations. After all of the processes in the manufacture of semiconductors are performed on a wafer, or after any series of processes is performed in one machine or at one location, wafers and the devices on the wafer are subjected to a series of tests to determine the existence of defects, if any, and whether the device conforms to production standards. The tests result in a determination of whether the wafer is to be passed on to the next process sequence or packaged and shipped to another location for further processing or incorporation into marketable components or products.

The testing of semiconductor wafers involves a number of characteristically different test procedures. In certain procedures, optical techniques are used to inspect the wafer for defects of a nature that such optical techniques can reveal. Such visual or optical inspections have typically involved the use of specialized test machines. Wafers have been loaded into such machines from standard cassettes that might include, for example, a stack of 25 wafers spaced on a rack within the cassette. A testing machine unloads the wafers individually from such a cassette, subjects each wafer to the optical inspection, and then returns the wafer to the cassette or loads it into a different cassette.

The testing of semiconductor wafers further involves testing by other than optical techniques, such as by the measuring of electrical resistances or other properties among points on the devices on a wafer by a multi-electrode probe that usually makes electrical contact with each of a plurality of points in electrical contact with the terminals of the device. Such electrical testing also usually involves the use of specialized test machines that differ from those by which the optical tests are performed. As with the optical test devices, wafers have been loaded into such machines from the cassettes, with a wafer handler in the machine unloading the wafers individually from the cassette. The machine subjects each wafer to the electrical test, and then returns the wafer to the cassette or loads it into a different cassette. Often, more than one test of an electrical nature is performed on a wafer, and each test is typically carried out by a testing machine dedicated to the performance of the particular test, which unloads and reloads wafers from and to a cassette before and after the testing.

The testing and inspection of semiconductor wafers involves a series of such tests, including more than one visual test and more than one test that is electrical in nature. The testing sequence usually further involves the inking or marking of devices on the wafers in response to the results of the tests as well as a baking of the wafer to cure the marking ink. The test processes are followed by the sorting of the wafers and the packaging of the tested wafers for transport to next manufacturing facility. If the last step in wafer processing has been performed, the next process performed on the wafers may be the slicing or separating of the individual devices from the wafer and the sorting of the good from the defective devices.

The sequence of tests, from the performance of the first test to the packaging of the wafers for further processing, has required the manual handling of the cassettes or the manual control of the transfer of the cassettes from one testing station to another. Such handling introduces the opportunity for damage to the wafers due to mishandling of the cassettes or due to errors in the movement of the cassettes among the stations. In addition, the timing of the transfer stages between various tests of the testing sequence has been dependent on the readiness of an operator to carry out the manual transfer operation, which is a source of delays of the testing process and the idleness of testing machinery whenever the operator is otherwise busy. Correlation of data from a sequence of independent test procedures that are manually linked by the actions of an operator is a source of potential delay and of potential error in the relation of the test results to process control decisions. Such reliance on the operator to move and coordinate the wafers to, through and from the testing processes requires substantial operator time.

The layout of equipment needed to carry out a variety of independent testing procedures has called for sufficient floor space to hold testing machines which each have loading and unloading stations. In addition, wafer and cassette holding stations, operator space and maintenance space must be provided to accommodate a number of independent stations.

There is a need in the inspection and testing of semiconductor wafers during and after the performance of various sequences of manufacturing processes for an integrated overall testing method and apparatus that eliminates unnecessary and unreliable steps in the process, and reduces time, space and cost.

SUMMARY OF THE INVENTION

Primary objectives of the present invention are to improve the overall efficiency, cost and reliability of semiconductor wafer testing processes in semiconductor wafer manufacture. Particular objectives of the present invention are to reduce the wafer handling required and the manual steps required in semiconductor testing. Further objectives of the present invention are to reduce time, space, cost and errors in semiconductor wafer testing and sorting processes. Objectives of the present invention particularly include overcoming the various problems and disadvantages of the present semiconductor testing practices identified above.

In accordance with the principles of the present invention, there are provided an integrated semiconductor wafer testing apparatus and a testing method therefor in which a variety of tests employing different testing media, techniques or sequences are performed in an integrated sequence of procedures.

In the preferred embodiment of the invention, a single machine is provided with a plurality of testing stations, including electrical testing stations and, preferably, also including optical testing, situated around a carousel conveyor supplied by at least one cassette unloading and/or loading station, thereby minimizing the loading and unloading of wafers and eliminating the manual transfer of wafers among intermediate processes of the testing operation. In the alternative or preferably in addition to the carousel conveyor, the machine is provided with a robotic transfer arm to move wafers individually among stations. With only a carousel conveyor, wafers can be more conveniently cycled through a standard sequence of sorting and testing steps. With only a robot transfer arm, wafers can be randomly moved among stations in sequences that may differ from the order of stations around the carousel so that different types of wafers, or wafers which have different test results, can be cycled through stations according to individualized sequences. In a preferred configuration, both a carousel conveyor and robot arm are used in combination so that standard sequences can be run most efficiently while still providing the capability for the transfer of selected wafers out of the sequence, for example, based on the test results or other factors, or to allow for sequence changes or changes in the types of wafers being processed. Preferably, wafers will carry a machine readable code identifying the devices on the wafer, identifying the customer or wafer type, and specifying other distinguishing information on which control of the testing process can be based.

The machine preferably also includes standby stations at which wafers may be placed when testing stations are being serviced or are otherwise unavailable, to facilitate the changing of testing sequences or to allow certain stations to perform tests that are timed differently than those at other stations. Further, a marking and a baking station, or a combined marking and baking station, may also be provided. Marking of a device (or a die as an individual device or circuit that will constitute a chip is called) is often employed where the device has been deemed defective as a result of the test. The machine includes a data and control system that sequences the machine and coordinates the testing data for use in specifying subsequent processing or routing of the wafers or devices thereon. This computer stores a map of each of the wafers, on which map is recorded the results of the various tests for the devices on the wafer. The marking station may mark the defective devices after all of the tests have been completed based on the data stored in the map, or the map may be preserved and linked to device and wafer identifying information so that it can accompany the wafers through subsequent processes. Such an alternative to marking the devices involves, for example, the use of the map by a subsequent process, such as to control a separating of the defective devices from the other devices when wafer is cut into the various chips, or in the routing of wafers or devices to particular orders.

In one preferred embodiment of the invention, a carousel conveyor is provided with at least eight equally spaced stations, including a first station which is a cassette unloading station, a last station next to the first station which is a cassette loading station, and six or more intermediate stations at which are positioned various testing process components. In an alternative embodiment, the loading and unloading stations may be included in a single cassette unloading and reloading station at which the path of the wafers on the carousel begins and ends. Preferably, the carousel conveyor includes eight equally spaced holders around the periphery of a rotatable circular table. Each holder may include, for example, a wafer holding plate, which a wafer is placed on and which can be lifted from the table to raise a wafer. The table is also preferably provided a plurality of standby holders, positioned for example inboard from the edge of the table, around the center at which wafers may be parked or accumulated to make the process sequence more flexible. Where a single unloading and loading station is used, an additional intermediate station is available for use in performing one of the other functions.

Through a cut-out at the center of the table is a rotatable and extendable wafer transfer arm, for example of a frog-leg type, that can pick up a wafer from any one of the holders and transfer it to any other one of the holders, or can transfer a wafer to and from a cassette at the loading or unloading stations. The table of the carousel conveyor indexes in 45° steps around a central axis to shift the holders around a circle of eight possible positions. A wafer lift mechanism, including a plurality of, for example three, lift pins, is provided at each position at which a holder may stop to lift the wafer from the wafer holding plate into position for pickup by the transfer arm or to receive a wafer from the transfer arm.

Of the potential testing stations of the one embodiment, at least one visual or optical testing station is provided, including preferably a final station immediately before the loading station. At this visual or optical station, a visual inspection is made for any number of potential defects or marks. This inspection may be made manually or at least include a manual backup inspection of a projected image of the dies on the wafer. Alternatively or in addition, an automated vision system may make an optical or visual inspection of the dies on the wafer or on various images of scans of the dies made in visible light or other media.

The station located around the carousel immediately before the final visual inspection station may include a baking or other ink curing station, or an inking and curing station, if the devices are to be marked. At the remainder of the testing stations are located electrical device testing assemblies that place probes in contact with the dies on the wafer to perform a specific electrical test, such as an electrical resistance test. The different stations may be configured to perform a different one of a plurality of different tests. For tests that require longer periods of time in order that they may be performed on a given wafer, more than one station can be equipped to perform the same test. With such an arrangement, half of the devices on a wafer can, for example, be thereby tested at one station and half of the devices tested at a second station. This divides the time to perform a given test on all of the devices on a wafer between more than one station, so that the time the carousel spends in each index position is not unduly lengthened by a test that is much longer to perform than the others.

Wafer cassettes, usually contain identical wafers, typically 25 wafers per cassette. Probing stations can be set to perform the same test. Thus, a great advantage of this invention is that many wafers, for example, six or eight, can be tested simultaneously using only one unloading station, whereas current machines test one wafer at a time yet require an unloading station whose mechanisms take up half the volume of the machine.

At each station, or at least at each testing station, is located a pop-up chuck, which is a vacuum chuck supported on an elevator mechanism below the plane of the carousel table. The chuck, when actuated, lifts the support plate and wafer from the holder into position for testing. This lifting places a particular die into contact with an electrical contact probe located in the testing assembly at the station. Before the chuck rises to lift the wafer, the probe is moved in an x-y plane into a position to make contact with a particular die on the wafer. At each station, the probe is positioned, under computer control, successively into each of the die positions, and when the probe stops at each position, the chuck lifts the wafer into contact with the probe, the test is made, and the chuck lowers the wafer along with the support plate, away from the probe so that the probe can be moved to the position of the next die. Wafers can also be equipped with Fast In Circuit Special Test Circuit Die Applications (FISCA), which are circuits on the wafer that connect a plurality of the individual devices or circuit dies together in a logical way that permits all or a plurality of the dies to be tested simultaneously with a single contact by the probe, and identifies the defective devices. The testing stations are particularly suited for such simultaneous testing.

The testing stations that include contact probes may be provided with polishing or burnishing assemblies that clean the probe contacts or shape them to insure that they lie in a plane or otherwise make simultaneous contact with the contact points of the dies that are being tested.

With the present invention, wafer handling steps, both robotic and manual, are considerably reduced in semiconductor wafer testing associated with semiconductor manufacture. The space required for the testing operations is also minimized and the number of operators required for the testing procedures is lowered. Maintenance is decreased while safety and reliability are increased in the testing processes. The overall cost and quality of the semiconductor manufacturing process are improved.

These and other objectives of the present invention will be readily apparent from the following detailed description of the present invention in which:

DETAILED DESCRIPTION OF THE PREFERRED EMBODIMENTS

Figure 1:
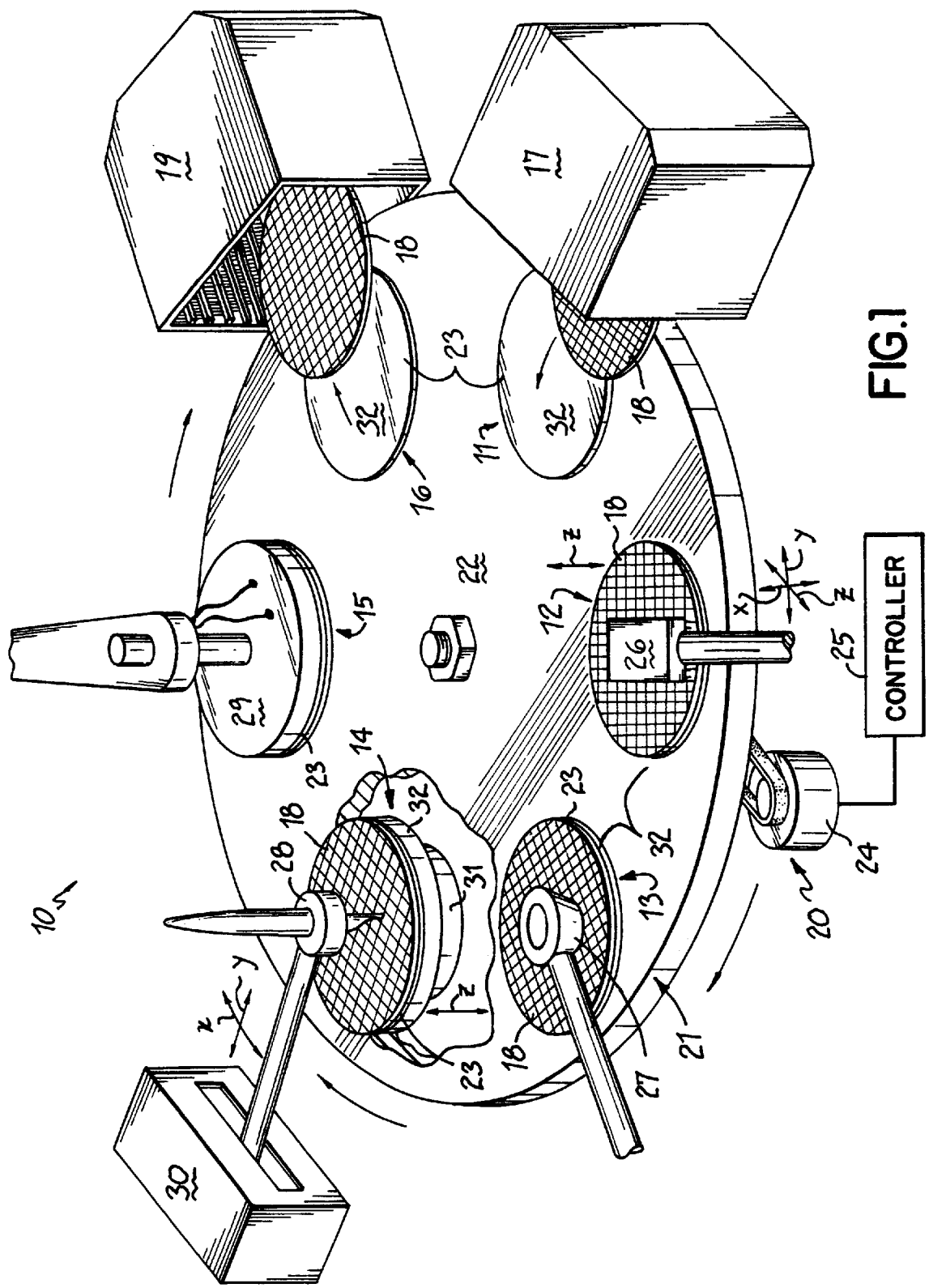
FIG. 1 is a schematic perspective representation of a semiconductor wafer testing apparatus embodying certain features of the present invention.

FIG. 1 diagrammatically illustrates an integrated semiconductor wafer testing apparatus 10 having a plurality of inspection stations or testing stations 12,13, a test result recording station or inking station 14, a baking or ink curing station 15, and a pair of cassette loading and unloading stations 16,11. The inspection or testing stations are of two types in the embodiment shown. These include electrical inspection stations 12 at which electrical testing of devices are carried out by contacting devices with a probe, and optical inspection stations 13 at which visual inspection is carried out without contacting the devices. The station 11 is, in the illustration, an unloading station at which a full cassette 17 of semiconductor wafers 18 to be tested is placed by an operator or automated transport device to be unloaded from the cassette 17 into the apparatus 10. The station 16 is, in the illustration, a loading station at which an empty cassette 19 is placed by an operator or automated transport device to receive wafers 18 that have been tested in the apparatus 10.

The apparatus 10 is provided with a conveying mechanism 20 for moving wafers 18 among the stations 11–16, which mechanism 10 is illustrated as including a rotary carousel conveyor 21 which includes a rotatable index plate 22, preferably disposed in a horizontal plane, having a plurality of wafer holders 23 mounted at equal angular intervals around the plate 22. The conveying mechanism 20 also includes a drive mechanism 24 for indexing the carousel conveyor 21 under the control of a programmed controller 25. The stations 11–16 are situated around the carousel conveyor 21 at equal angular intervals that coincide with the intervals at which the holders 23 are spaced around the index plate 22 of the carousel conveyor 21. At the loading and unloading stations 16,11 is provided a loading device (not shown) for moving wafers 18 between the cassettes 17,19 and wafer holders 23 located at the loading or unloading stations 16,11.

Of the stations 11–16, several are provided for testing and storing information of the condition of devices or dies on the wafers 18. For example, testing stations 12,13 include inspection heads 26,27 by which the devices on the wafers 18 are tested by sensing information from the wafers 18. Heads 26 are probe heads that electrically contact devices on the wafers, while heads 27 are optical heads by which devices are visually inspected. The inking station 14 includes a writing head 28, particularly an inking or marking head which places information on the wafers 18 to identify devices on the wafers 18 that have been determined to be defective as a result of a test performed at one of the stations 12,13 with one of the inspection heads 26,27. The curing station 15, in the illustration, is provided with a baking or curing chamber 29 that closes over a wafer 18 at the station 15 to heat the wafer 18 to cure ink markings applied to the wafer by the marking head 28 at the inking station 14. The heads 26–28 are at the inspection and marking stations are mounted on positioning devices 30 which move the heads 26–28 in horizontal x-y planes parallel to the surfaces of the wafers 18 to position the heads 26–28 over and proximate specific devices on the wafers 18, so that the specific devices can be tested or marked by the heads 26–28.

At certain of the stations 11–16, particularly those at which a testing or marking operation is to be performed on individual devices on a wafer 18, such as at stations 12–14, there is provided a pneumatically operated wafer-gripping elevator or pop-up chuck 31. The chucks 31 are fixed at respective wafer positions at the stations 12–14 adjacent the testing and marking devices 26–28. The holders 23 on the indexing plate 22 of the carousel conveyor 21 are each provided with a wafer support plate 32, which is moveably mounted on each of the holders 23. The chucks 31 are operable, when a holder 23 has been indexed to and stopped at the wafer position at the stations 12–14, to vacuum clamp the wafer 18 to the chuck 31 and to lift the wafer support plate 32 carrying a wafer 18 thereon above the table 22. Specifically, the chuck 31 is adapted to lift a wafer 18 into position immediately below one of the heads 26–28, which has been positioned in the x-y plane horizontally adjacent a selected device on the wafer 18, so that the head can operate on the selected device. The head x-y moving mechanism is shown only schematically in FIG. 1, but is described in more detail in connection with FIG. 2.

The testing station 12 is an electrical testing station at which the testing head 26 is provided with an electrical probe for performing one of any number of electrical tests on devices on the wafer 18. When the elevator or pop-up chuck 31 raises the wafer 18 at the electrical testing station 12, the wafer 18 moves into contact with the probe of the head 26 and contact is made with predetermined points on the wafer 18 to perform an electrical test on a device on the wafer 18. Similarly, the marking station 14 is an inking station at which the marking head 28 is provided with an inking element for physically depositing a machine readable ink mark on selected devices on the wafer 18 that have been, for example, determined to be defective by a test performed at one of the testing stations 12 or 13. When the elevator or pop-up chuck 31 raises the wafer 18 at the marking station 14, the wafer 18 moves into contact with the marking element of the head 28 and an ink mark is deposited on the wafer to mark and thereby identify a defective device on the wafer 18. On the other hand, the testing station 13, which is an optical testing station at which the testing head 27 is provided with a visual or optical probe for performing a visual test on devices on the wafer 18, the test is performed by positioning of the wafer 18 close to, but not necessarily in contact with, an optical probe on the head 27. When the elevator or pop-up chuck 31 raises the wafer 18 at the optical testing station 13, the wafer 18 moves a predetermined distance from, but not necessarily into contact with, the probe of the head 27 so that an optical or visual inspection can be made of predetermined devices on the wafer 18.

Figure 2:
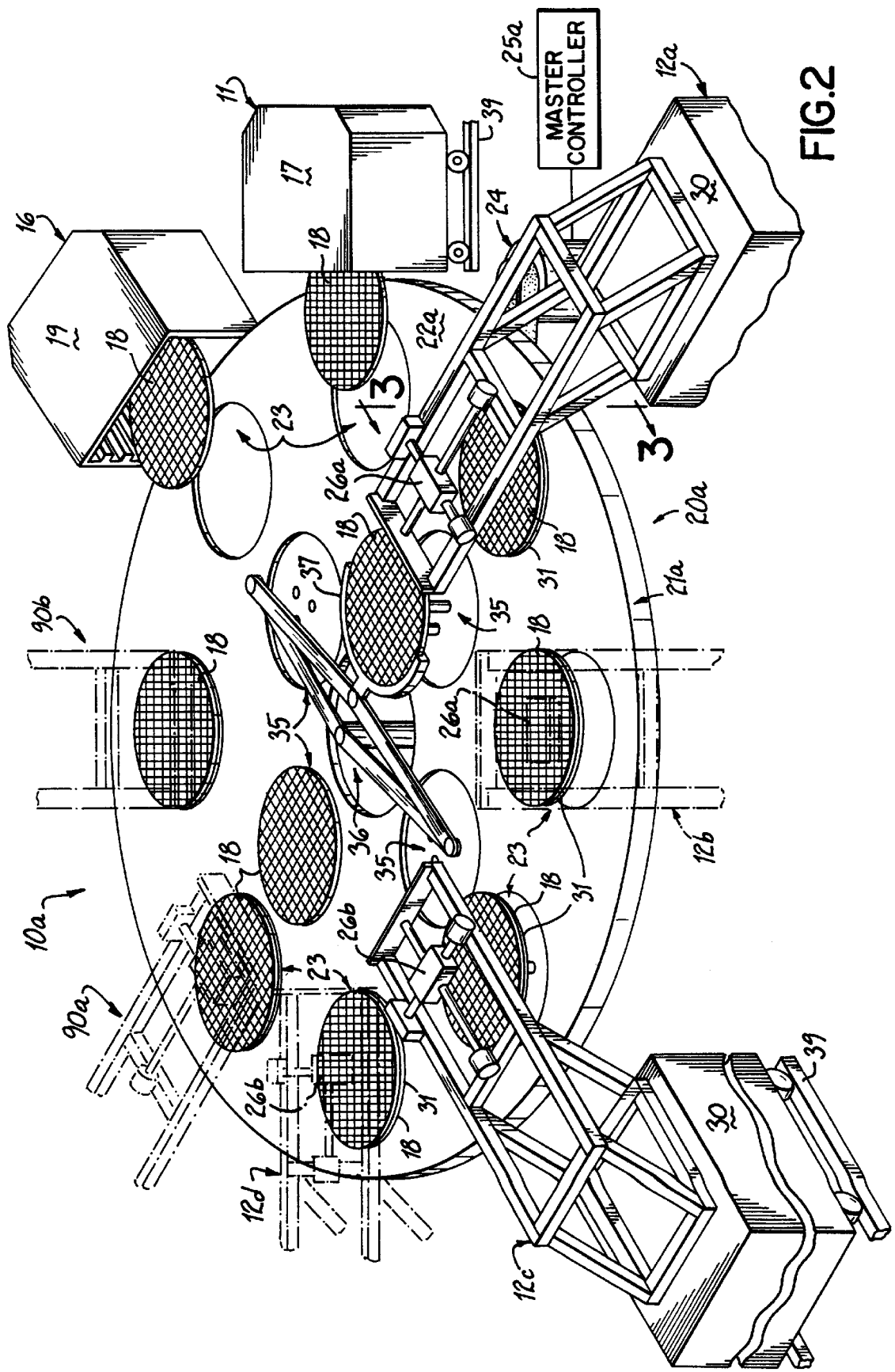
FIG. 2 is a perspective diagram, similar to FIG. 1, illustrating one preferred embodiment of the testing apparatus of FIG. 1.

FIG. 2 illustrates a preferred embodiment of an apparatus 10a having features of the apparatus 10 of FIG. 1. The apparatus 10a includes wafer unloading station 11, a plurality of electrical testing stations 12a,12b,12c,12d, and two additional stations 90a and 90b, and cassette loading station 16. The stations 90a,90b may include a first station 90a that is a combined inking and baking station 14 and 15 of FIG. 1 followed by a second station 90b that is a final optical inspection station 13 of FIG. 1 at which visual inspection of defects on the substrates 18 takes place as well as inspection of the markings placed by the marking station. Alternatively, the first station 90a may be a visual inspection station with the second station 90b being a final marking and curing station. Visual inspection and marking may, alternatively, be performed on a separate apparatus.

The apparatus 10a is also provided with four standby stations 35. A conveying mechanism 20a is provided for moving wafers 18 among the stations 11–16, which mechanism 20a is illustrated as including a rotary carousel conveyor 21a which includes a rotatable index plate 22a having a plurality of eight wafer holders 23 mounted at equal angular intervals around the plate 22a. The conveying mechanism 20a includes drive mechanism 24 for indexing the carousel conveyor 21a under the control of programmed controller 25a. The stations 11–16 are situated around the carousel conveyor 21a at equal angular intervals that coincide with the intervals at which the holders 23 are spaced around the index plate 22a of the carousel conveyor 21a.

The conveying mechanism 20a also includes an extendable robot transfer arm 36. The arm 36 has a gripper 37 at the remote end thereof and is pivotally mounted at its other end at the center of the plate 22a, as further illustrated in FIG. 3. The arm 36 is extendable to move the gripper 37 to and from the unloading and loading stations 11,16 for moving wafers 18 respectively out of and into the cassettes 17,19 and between the cassettes and the wafer holders 23 located at the stations 11,16. The unloading station 11 is equipped with a wafer chuck at the station that has wafer aligning capability by operating under the control of controller 25a through manipulation of the load arm 36 to center and orient the wafer 18 on the holder 31 at the station 11. The arm 36 also is operable to transfer wafers between and among any of the holders 23 on the index plate 22a and to or from any of the standby stations 35 and any holder 23 on the index plate 22a. Below each of the standby stations 35 and at each of the stations 11–16 below the positions of each of the holders 23, is a set of lift pins 38 which raise and lower wafers 18 for transfer to or from the gripper 37 on the transfer arm 36.

Electrical testing stations 12a,12b and 12c,12d are provided with probe heads 26a and 26b, respectively, by which the devices on the wafers 18 are tested by sensing information from the wafers 18. Heads 26a at stations 12a,12b perform a first contact electrical test simultaneously on devices on different wafers 18 in different holders 23 of the index plate 22a at stations 12a,12b, while heads 26b at stations 12c, 12d perform a second contact electrical test simultaneously on different wafers 18 in different holders 23 of the index plate 22a at stations 12c,12d. By providing two stations for each of the first and second tests, the testing of a different half of the devices on each wafer can be made at each of two stations, which reduces the time each wafer must spend at each station and increases the indexing rate of the carousel conveyor 21a, and thereby the throughput of the machine 10a.

The inking and curing station 14a includes a writing head 28, which places information on the wafers 18 to identify devices on wafers 18 that have been determined to be defective as a result of a test performed at one of the stations 12a,12b,12c and 12d with one of the inspection heads 26a,26b. The curing performed at the station 14a is similar to that described in connection with the station 15 of FIG. 1, where a heated closure 29a descends over the wafer to heat and cure the ink deposited by the writing head 28. Alternatively, instead of marking defects detected by the electrical testing stations 12, information may be stored and correlated with wafer identifying information in the controller 25a. The final optical inspection station similar to the station 13 described in connection with FIG. 1. At this station, visual images are viewed with optical inspection head 28, either manually or with a computerized vision system, to determine if visually detectable defects are present on any device on the wafer 18 or to evaluate the markings placed on rejected devices by the marking station 14. Optical testing may also include inspecting the markings placed by the marking station 14, as well as optically detectable defects in the manufacture of the devices on the wafers 18. The optical test results are preferably stored in the controller 25a. In most arrangements, an optical testing station 13 is located before the marking station 14 and the results of the optical test are used to mark the devices at the marking station 14. Visual inspection may also take place in a separate machine after removal from the machine 10a where the optical inspection is carried out prior to packing of the wafers or the separating of the devices from the wafers.

The heads 26a,26b at the inspection stations 12a–d and the heads at the optical inspection and marking stations 90a,90b are mounted on cantilevered supports 130 extending from positioning device consoles 30 which move the heads in horizontal x-y planes parallel to the surfaces of the wafers 18 to position the heads over and proximate specific devices on the wafers 18, so that the specific devices on the wafer 18 are each individually tested, inspected or marked by the heads. In addition, each of the positioning device consoles 30 and the cassettes 17 and 19 are moveably mounted on tracks 39 to move into and out of position around the carousel conveyor 21a adjacent their respective stations 11–16. The consoles 30 are capable of being locked in precise positions around the machine 10a so that the heads can be positioned with accuracy to the devises on the wafers.

The cantilevered supports 130 are fixed to the tops of the consoles 30 and include bridges 131 that extend over the respective holders 23 at the stations of the carousel conveyor 21a. On the bridges 131 are mounted a pair of highly precise head positioning servo or stepper motors 132 and 133 that respectively drive orthogonally arranged lead screws 134 and 135 so as to position heads 26,27 with microscopic tolerances, in the micron sized increments, in the x-y horizontal plane over the wafer, which is aligned on the holder 23, for example, with the columns and rows of devices thereon respectively parallel and perpendicular to the radius of the index plate 21a.

At a testing station 13 (FIG. 1), which is an optical testing station that may be at stations 90a or 90b of FIG. 2, testing head 27 is provided with a visual or optical probe for performing a visual test on devices on the wafer 18, the test is performed by positioning of the wafer 18 close to, but not necessarily in contact with an optical probe on the head 27. When the elevator or pop-up chuck 31 raises the wafer 18 at the optical testing station 13, the wafer 18 moves a predetermined distance from, but not necessarily into contact with, the head 27, which, preferably, includes a camera for making optical or visual inspection of predetermined devices on the wafer 18. The optical probe head 27 may be moved automatically under control of the controller 25,25a or manually by an operator using, for example, a joy stick while viewing the devices on a monitor then entering data through a keyboard or panel or other data entry device.

At certain of the stations 11–16, particularly those at which a testing or marking operation is to be performed in individual devices on a wafer 18, such as at stations 12,12a–d and 13, wafer-gripping elevator or pop-up chuck 31 is provided beneath each of the positions at which the wafer holders 23 stop after the table 22a is indexed. The holders 23 on the indexing plate 22 of the carousel conveyor 21 are provided with wafer support plates 32, which are moveably mounted on the holders 23. The chucks 31 are operable, when a holder 23 has been indexed to and stopped at the wafer position at the stations 12a–d or 13a, to vacuum clamp the wafer 18 to the chuck 31 and to lift the wafer support plate 32 carrying a wafer 18 thereon above the table 22. Specifically, each chuck 31 is adapted to lift a wafer 18 into position immediately below one of the heads 26,26a, 26b or 27, which has been positioned in the x-y plane horizontally adjacent a selected device on the wafer 18, so that the head can operate on the selected device. The sequence of these movements is that the chuck 31 holds the wafer 18 below the head 26,26a,26b,27 for example, while the head 26,26a,26b,27 moves to an x-y position over one of the devices on the wafer 18. Then the chuck 31 lifts the wafer 18, for example, into contact with the probe on the head 26a,26b, which performs the test under the control of the controller 25a. Then the chuck 31 lowers the wafer 18 while the head 26a,26b moves to an x-y position over another device on the wafer 18, which is in turn lifted into contact with the probe on the head 26a,26b.

Figure 3:
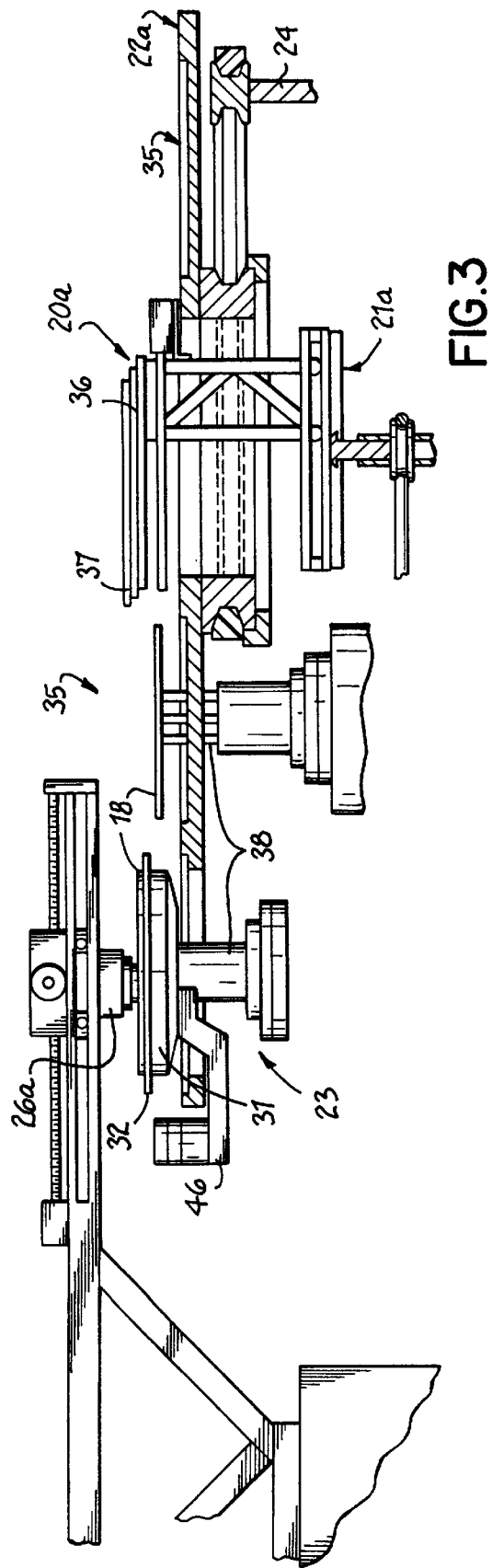
FIG. 3 is a cross-sectional view, taken along the line 3—3 of FIG. 2, showing a wafer chuck in a position at a station for probing of the wafer with a probe head.
Figure 3A:
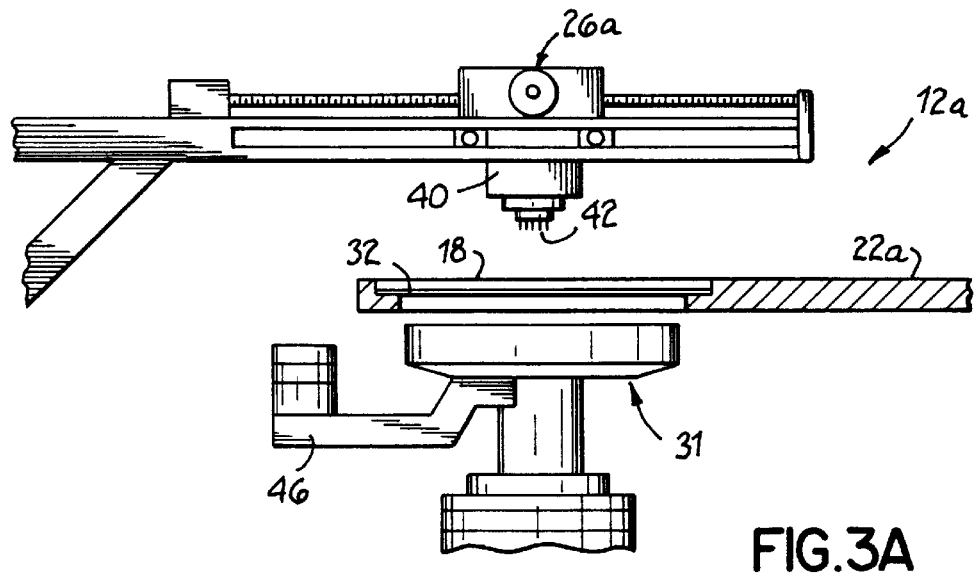
FIG. 3A is a partial cross-sectional view of a portion of FIG. 3, illustrating a wafer chuck in a position at a probing station that it assumes during the indexing of a wafer from one station to another.

FIG. 3A illustrates a pop-up chuck 31 in a lowered position below the index table 22a at one of the electrical testing stations 12a–d, for example station 12a.

The chuck 31 remains in this lowered position, below the plane of the index plate 22a, as the plate 22a indexes the wafers 18 held by the holders 23 around the stations 11–16. The plate 22a is shown positioning a holder 23 at the station 12a, with a wafer 18 in the holder 23 and a support plate 32 underlying and supporting the wafer 18. At the station 12a, the electrical testing head 26a is illustrated with a probe 40 thereon having a plurality of downwardly extending electrodes 42 on the bottom thereof to make electrical contact with the testing terminal contacts (not shown) of a selected device on the wafer 18. At each of the electrical testing stations 12, a burnishing or polishing assembly 46 may be provided to clean, polish or planarize the tips of the probe contacts on the testing head 26. The assembly can be moved into contact with the tips of the probe contacts at periodic intervals or when activated by an operator to service the contacts between the tests performed on the wafers 18 by the heads 26.

Figure 3B:
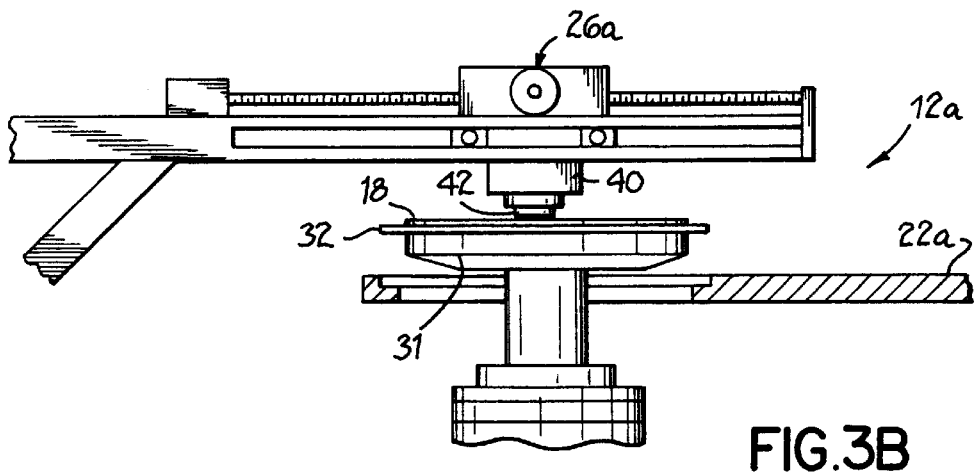
FIG. 3B is a partial cross-sectional view, similar to FIG. 3A, illustrating the wafer chuck at a probing station in a position that it assumes during positioning of the probe head.

In FIG. 3B, pop-up chuck 31 in is partially raised against the support plate 32 of the holder 23 that is indexed to electrical testing station 12a. From the center of the chuck 31, lift pins 38 are shown in a raised position extending through one or more openings in the support plate 32 to lift a wafer 18 from the holder 23 to a vertical position above the table 22a to permit the gripper 37 at the end of the transfer arm 36 to be positioned under the wafer 18. With the transfer arm 36 extended to place the gripper 37 under the wafer 18, the pins 38 can retract downwardly into the chuck 31 to lower the wafer 18 onto the gripper 37, whereby the wafer 18 is picked up by the gripper 37 from the holder 23. When operated in reverse, a wafer 18 can be placed in a holder 23 by the gripper 37 by extension of the transfer arm 36 to place the wafer 18 over the retracted pins 38, then the pins 38 are raised to lift the wafer 18 from the gripper 37, the arm 36 retracts, and the pins 38 then lowers the wafer 18 onto the support plate 32 of the holder 23.

Figure 3C:
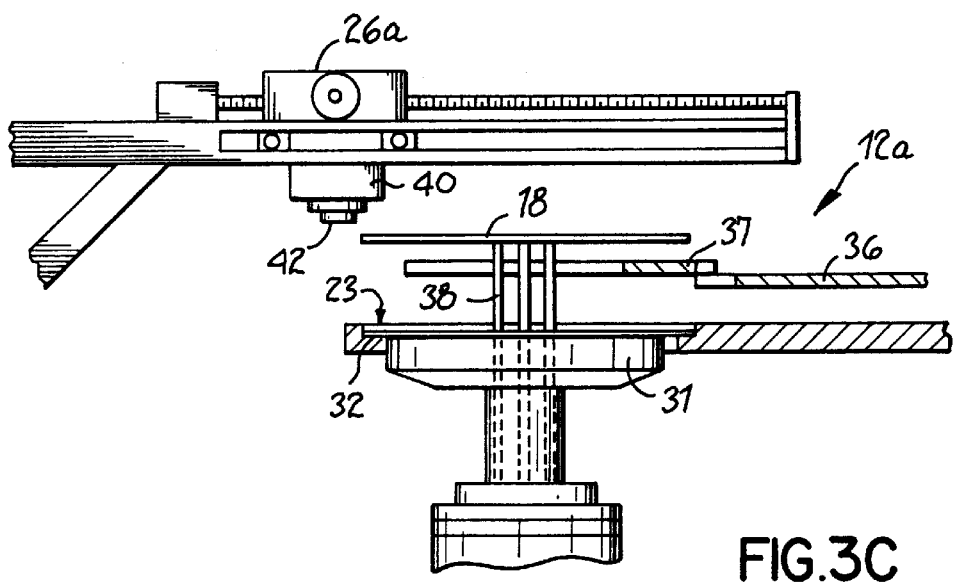
FIG. 3C is a cross-sectional view, similar to FIGS. 3A and 3B, illustrating the wafer chuck at a probing station in position for transfer of a wafer to and from a holder on a carousel conveyor that is in alignment with the chuck.

In FIG. 3, the pop-up chuck 31 is shown in a raised position at which it holds a wafer 18 in contact with the electrodes 42 of the probe 40 on the electrical testing head 26. In FIG. 3C, the chuck 31 is in a lower raised position to which the wafer 18 is moved from the position of FIG. 3 so that the probe 40 can be repositioned in x-y directions in a horizontal plane from a position over a device on the wafer 18 that has been tested to a position above a different device on the wafer 18 that is yet to be tested. When the probe 40 has been so repositioned, the chuck 31 again lifts the wafer 18 to the height shown in FIG. 3 so that this next device is in contact with electrodes 42 on the probe 40 and ready to be tested.

With the apparatus 10a of FIGS. 2–3C, the stations 11–16 are selected and arranged to perform a standard sequence of tests on wafers 18 with one unloading and loading of cassettes 17,19. This greatly shortens the time required for the testing of wafers and greatly reduces the likelihood that routing errors or damage to the wafers will occur during testing. For the standard sequence, the carousel conveyor 21a carries the wafers 18 through a pre-configured series of testing and/or marking stations 12–14. If for any reason any of the wafers 18 is to be routed through a different series of stations or through stations in a different order than the standard sequence, the transfer arm 36 can move wafers 18 between and among any combination of the stations or holders, including the standby stations 35. The standard sequence can be customized to particular customer requirements, with different stations positioned at different locations around the conveyor 20.

From the above description of the invention and the preferred embodiments, one skilled in the art will appreciate that variations and additions may be made to the processes and the equipment described without departing from the principles of the invention.

What is claimed is:

1. An apparatus for testing and inspecting semiconductor wafers having a plurality of devices at least partially formed thereon comprising:

at least one cassette station for the unloading of wafers from a cassette and the loading of wafers onto a cassette;

a plurality of wafer inspection or test stations disposed around a vertical axis;

each inspection station having thereat an inspection head moveable in a horizontal plane to a position adjacent a selected device on a horizontally disposed wafer located at the inspection station;

a transfer mechanism operable to transport wafers between the at least one cassette station and the inspection stations, the transfer mechanism including a carousel that includes a horizontal table that is rotatable about said vertical axis and has a plurality of wafer holders at fixed locations thereon spaced radially from and angularly around the axis such that, when the table is angularly indexed around the axis, different ones of the wafer holders simultaneously move individual wafers sequentially to positions at different ones of the stations, the transfer mechanism further including a robot arm operable to move a wafer non-sequentially between any of a plurality of the holders on the table and any of a plurality of other holders on the table or a cassette; and at least one wafer elevator operable to raise a wafer, transported to a test or inspection station by the transfer mechanism, from a wafer holder vertically upward into a test or inspection position adjacent a test or inspection head at one of the test or inspection stations and for lowering the wafer vertically from the test or inspection position.

2. The apparatus of claim 1 wherein:

each inspection station has the inspection head thereof operable to perform an electrical test on the selected device on the wafer upon moving into electrical contact with the selected device on the wafer; and the at least one wafer elevator is operable to raise the wafer transported to the inspection station vertically upward to make electrical contact between the selected device on the wafer with the inspection head when the head is horizontally moved into adjacent the selected device.

3. The apparatus of claim 2 wherein:

the plurality of test or inspection stations includes at least one inspection station having a visual inspection head located thereat operable to perform a visual inspection of devices on a wafer thereat.

4. The apparatus of claim 1 wherein:

the plurality of stations includes at least one inspection station having a visual inspection head located thereat operable to perform a visual inspection of devices on a wafer.

5. The apparatus of claim 1 wherein:

the robot arm is supported on the vertical axis at the center of the carousel.

6. The apparatus of claim 1 wherein:

the robot arm is operable to pick-up, move and place a wafer respectively from, between and onto any arbitrary one of the wafer holders.

7. The apparatus of claim 1 wherein:

at least one cassette station is an unloading and reloading station at which wafers are unloaded from a cassette to the transfer mechanism and reloaded from the transfer mechanism to the cassette.

8. The apparatus of claim 1 wherein:

at least one cassette station includes at least two cassette stations, including an unloading station at which wafers are unloaded from a cassette to the transfer mechanism and a loading station at which wafers are loaded from the transfer mechanism to a cassette.

9. An apparatus form inspecting semiconductor wafers having a plurality of devices at least partially formed thereon comprising:

at least one cassette station for the unloading of wafers from a cassette and the loading of wafers onto a cassette;

a plurality of wafer inspection stations disposed around a vertical axis;

a conveyor system having a plurality of fixed wafer holding positions thereon and being operable to hold a plurality of wafers and to move each wafer of the plurality sequentially to the stations, the conveyor system including a carousel rotatable about the vertical axis with each of the wafer holding positions being located thereon and spaced radially from and angularly around the axis such that, when the carousel is angularly indexed around the axis, the wafer holding positions are each simultaneously moved between different pairs of adjacent stations;

the plurality of inspection stations including at least one optical inspection station having an optical inspection head supported thereat for sensing visual information from a wafer located at the station;

the plurality of stations including a plurality of electrical inspection stations each having an electrical inspection head that includes an electrical test probes for coupling to a wafer thereat and sensing electrical information from said wafer;

recording media capable of recording information sensed from the wafers at the stations and to relate the sensed information to the wafer from which the information is sensed and to a particular portion of the wafer from which the information is sensed; and a controller operable to control (a) motion of the conveyor, (b) the operation of inspection stations and (c) the recording media so as (i) to move each of the wafers of the plurality from a cassette at the at least one cassette station, to and from the at least one optical inspection station and to and from at least one of the first, and at least one of the second, electrical inspection stations, (ii) to sense visual information and electrical information from the first and the second tests from each of a plurality of different portions of each of the wafers and to a cassette at the at least one cassette station, and to record, at least selectively, information sensed from the wafers.

10. The apparatus of claim 9 wherein:

the plurality of electrical inspection stations includes a first electrical inspection station operable to perform a first test on a wafer located thereat and a second electrical inspection station operable to perform on a wafer located thereat a second test that differs from the first test.

11. The apparatus of claim 9 wherein:

the plurality of inspection stations includes one electrical inspection station operable to perform a test on some devices on a wafer located thereat and another electrical inspection station operable to perform the same test on other devices on a wafer located thereat.

12. The apparatus of claim 9 wherein:

the plurality of electrical inspection stations includes a plurality of first electrical inspection stations each operable to perform a first test on a wafer located thereat and a plurality of second electrical inspection stations each operable to perform on a wafer located thereat a second test that differs from the first test.

13. The apparatus of claim 9 wherein:

the plurality of electrical inspection stations includes a plurality of first electrical inspection stations each operable to perform a first test on a wafer located thereat and a plurality of second electrical inspection stations each operable to perform on a wafer located thereat a second test that differs from the first test; and the controller being further operable to control the movement of each of the wafers of the plurality to and from at least one of the first, and at least one of the second, electrical inspection stations and to sense electrical information from the first and the second tests from each of a plurality of different portions of each of the wafers.

14. The apparatus of claim 9 wherein:

the probe at each of the electrical inspection stations is moveable in a plane parallel to a wafer thereat to a position adjacent a selected portion of a wafer to perform the respective test thereon; and each electrical inspection station includes a holder for supporting the wafer thereat in an orientation parallel to the plane, which holder is moveable perpendicular to the plane to move the wafer into and out of contact with the probe when the probe is in the position adjacent the selected portion of the wafer.

15. The apparatus of claim 9 wherein:

the conveyor system is operable to index each of the plurality of wafers from the unloading station, then sequentially to and from each of the first electrical and second electrical inspection stations, then to and from the optical inspection station and then to the loading station.

16. The apparatus of claim 9 wherein:

the robot arm is supported on the vertical axis of the carousel and is operable to transfer wafers to and from any of a plurality of the wafer holding positions on the carousel.

17. The apparatus of claim 9 wherein:

the apparatus includes at least one standby station; and the robot arm is operable to transfer wafers to and from any of a plurality of the wafer holding positions on the carousel and to and from the standby station.

18. The apparatus of claim 9 wherein:

the robot arm is operable to transfer wafers to and from wafer holding positions at or adjacent different ones of the stations.

19. The apparatus of claim 9 wherein:

the at least one cassette station is an unloading and reloading station at which wafers are unloaded from a cassette to the carousel and reloaded from the carousel to the cassette.

20. The apparatus of claim 9 wherein:

the at least one cassette station includes an unloading at which wafers are unloaded from a cassette to the transfer mechanism and a loading station at which wafers are loaded from the transfer mechanism to a cassette.

21. A method of inspecting semiconductor wafers comprising the steps of:

unloading a plurality of semiconductor wafers sequentially from a cassette;

loading the unloaded wafers sequentially to a cassette;

after unloading any one of the wafers from the cassette and before loading said one of the wafers to a cassette, transporting said wafer sequentially through a first electrical inspection station, through a second electrical inspection station and through an optical inspection station by indexing each of the wafers on a carousel from a cassette station, sequentially through each of the inspection stations, and to a cassette station;

at the first inspection station, electrically coupling to the wafer with an electrical probe, sensing electrical information from said wafer and performing therewith a first test, and storing, at least selectively, data based on the first test correlated to data identifying the wafer and to data identifying a portion of the wafer to which the stored sensed information relates;

at the second inspection station, electrically coupling to the wafer with an electrical probe, sensing electrical information from said wafer and performing therewith a second test different from the first test, and storing, at least selectively data based on the second test correlated to data identifying the wafer and data identifying a portion of the wafer to which the stored sensed information relates; and at the optical inspection station, sensing visual information from the wafer and storing, at least selectively, data based on the sensed optical information correlated to data identifying the wafer and data identifying a portion of the wafer to which the stored sensed information relates.

22. The method of claim 21 wherein:

the transporting step includes the step of indexing each of the wafers on a carousel from the unloading station, sequentially through each of the inspection stations, and to the loading station.

23. The method of claim 21 further comprising, at each electrical inspection station, the steps of:

moving the probe in a plane parallel to a wafer thereat to a position adjacent a selected portion of a wafer and performing the respective test thereon; and supporting the wafer on a holder in an orientation parallel to the plane, and moving the holder perpendicular to the plane to move the wafer into and out of contact with the probe when the probe is in the position adjacent the selected portion of the wafer.

24. The method of claim 21 further comprising the step of:

generating a map from the stored information and containing information for locating devices on the wafer selected on the basis of the results of the tests.

* * * * *